United States Patent
Zanchi

(10) Patent No.: US 6,958,628 B2
(45) Date of Patent: Oct. 25, 2005

(54) THREE-TRANSISTOR NAND AND NOR GATES FOR TWO-PHASE CLOCK GENERATORS

(75) Inventor: Alfio Zanchi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 191 days.

(21) Appl. No.: 10/680,883

(22) Filed: Oct. 8, 2003

(65) Prior Publication Data

US 2005/0093576 A1 May 5, 2005

(51) Int. Cl.[7] .............................................. H03K 19/00
(52) U.S. Cl. ........................................ 326/93; 326/121
(58) Field of Search ............................ 326/93–98, 112, 326/119, 121

(56) References Cited

U.S. PATENT DOCUMENTS 6,542,017 B2    4/2003   Manganaro

OTHER PUBLICATIONS

Weste, et al, Principles of CMOS VLSI design, Addison–Wesley, Reading, MA, 1993.
Zanchi, et al, Measurement and Spice prediction of sub-picosecond clock jitter in A–to–D converters, in Proceedings of the ISCAS 2003, Bangkok, Thailand, May 2003.
Shinagawa, et al, Jitter analysis of high–speed sampling systems, IEEE Journal of Solid–State Circuits, vol. 25, No. 1, Feb. 1990, pp. 220–224.
McNeill, Jitter in ring oscillators, IEEE Journal of Solid–State Circuits, vol. 32, No. 6, Jun. 1997, pp. 870–879.
Sedra, et al, Microelectronic circuits, Sounders College Publishing, Orlando, FL, 1991.
Johnson, A symmetric CMOS NOR gate for high–speed applications, IEEE Journal of Solid–State Circuits, vol. 23, No. 5, Oct. 1988, pp. 1233–1236.
Manganaro, An improved phase clock generator for interleaved and double–sampled switched–capacitor circuits, in Proceedings of the ICECS 2001, Malta, Sep. 2001, pp. 1553–1556.

*Primary Examiner*—Don Le
(74) *Attorney, Agent, or Firm*—W. Daniel Swayze, Jr.; W. James Brady; Frederick J. Telecky, Jr.

(57) ABSTRACT

A two-phase non-overlapping clock generator (12) generating a sampling signal (20) utilizing a three transistor NAND gate (50). The NAND gate of the present invention eliminates one large PMOSFET (46), and has one NMOSFET (52) driven by the other phase and having its source grounded. The present invention yields substantial improvement on the jitter of the clock phases. Both rising and falling transitions are improved because of the greatly reduced self-loading of the NAND gate. Overshooting is eliminated, and the NAND gate body effect is minimized, providing enhanced jitter performance of the sampling signal and improving a signal to noise ratio (SNR). The principle of the present invention are also embodied in a NOR gate (70).

47 Claims, 9 Drawing Sheets

THREE-TRANSISTOR NAND AND NOR GATES FOR TWO-PHASE CLOCK GENERATORS

FIELD OF THE INVENTION

The present invention is generally related to precision signal sampling circuits, and more particularly to sampling signals sensitive to signal-to-noise ratios, such as two-phase clock generators used in analog circuits including high-speed analog-to-digital converters (ADC's).

BACKGROUND OF THE INVENTION

In high-speed ADC applications, as well as in every other instance when sampling of an analog signal is involved (i.e. optical receivers, data stream "slicers", etc.), the precision of the sampling instant impacts the signal-to-noise ratio (SNR) of the discrete-time signal fed into the system. Accordingly, the stability of the timing reference is of paramount importance. From the 12-bit level accuracy on, the thermal noise contribution to SNR has to be minimized to such an extent that a noise contribution coming from sampling jitter of 1 ps or higher becomes the limiting factor for SNR—at least from 70 MHz input frequency on.

A very clean time reference (OCXO, or other crystal-based solution, further band-pass filtered) must be provided to the non-overlapped phase generation circuits. In turn, the on-chip circuits must provide a clean transition edge to the sampling device—usually a simple switch—driven through a carefully optimized, short path within the clock distribution tree. The thermal noise of the logic gates, and especially the voltage bounce of the supply rails, can significantly degrade the stability of the clock period, introducing perturbations on the time of occurrence of the sampling edge which are inversely proportional to the slope of the waveforms featured at every node.

SUMMARY OF THE INVENTION

The present invention achieves technical advantages by allowing the circuit designer to simplify the NAND/NOR logic gates used in non-overlapped phase generation circuits, eliminating 1 transistor out of 4 that can be proven redundant in a synchronization application. The associated reduction in the capacitive self-loading seen at the gate output advantageously enables much steeper fronts on the output voltage, eventually ameliorating the jitter performance of the whole clock generator.

The present invention may be incorporated in a novel clock structure implemented for a high speed (80 MSps) high-input frequency (for use in receivers with up to 225 MHz IF) 14-bit analog-to-digital converter (ADC), lowering the jitter from 530 fs down to 230 fs. To date, this ranks as the lowest jitter CMOS-based clock ever implemented and tested in an ADC. In turn, the jitter performance boosts the SNR performance of an ADC from about 60 dBFS at 80 MSps, 220 MHz input to as high as 67 dFS in the same conditions.

The present invention advantageously exploits the timing sequence of the signals driving a NAND gate. The present invention recognizes that since the pull-up operation of a node B2 is dictated by a node B1 only, keeping two PMOSFET devices in the NAND gate is redundant. In fact, the PMOSFET 46 driven by node A4 in FIG. 3, which will be described in detail shortly, covers an input-to-output transition which is possible in principle, but that never happens in practice when the NAND is embedded in the classical two-phase clock loop of FIG. 1. According to the present invention, the structure of the NAND gate 44 is simplified whereby the NAND gate essentially becomes an inverter driven by node B1, whose pulldown operation is only conditioned to node A4. In other words, the essence of the NAND logic is preserved through the series of two NMOSFETs, whereas the active pull-up can be guaranteed by utilizing only one PMOSFET.

The NAND gate of the present invention improves the clock generation and distribution on-chip, reducing the jitter of internal clock networks, and simplifies the structure of the NAND CMOS gates built inside the two-phase generator, providing an enhanced solution right at the very root of the problem. The principles and advantages of the present invention is also applicable to a NOR gate.

The present invention finds particular advantages in two-phase non-overlapped clock circuits of Analog-to-Digital data converters, as well as any circuit having a two-phase non-overlapped clock generator.

DETAILED DESCRIPTION OF THE PREFERRED EMBODIMENT

Figure 1:
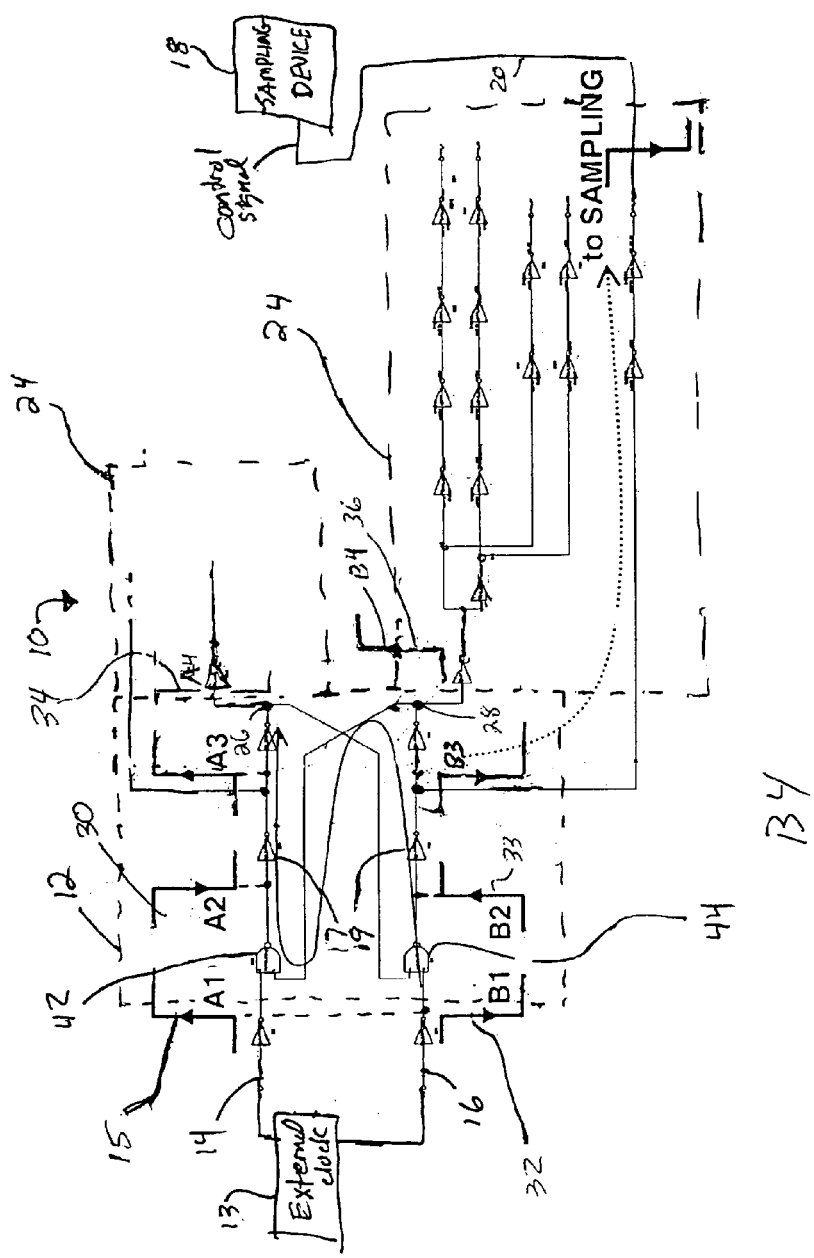
FIG. 1 is a schematic of a conventional two-phase non-overlapping clock generating network, wherein a transition at the output node A4 is not aligned with the complementary transition at output node B4.

Referring to FIG. 1, there is shown a prior art clock generator circuit 10, having a 2 input 6-gate loop network shown at 12 which performs non-overlapping of the two phases provided at inputs 14 and 16, and outputs a synchronization signal to a sampling device 18 at output 20. An inverter tree 24 receives the respective output 26 and 28 of the loop 12 and is a tapered clock distribution/edge regeneration circuitry. If the sampling device 18 receiving output 20 is modeled as a simple NMOSFET switch connected to a sampling capacitor for ease of discussion, the timing sequence in circuit 12 shown at 32, 33, and 28 drives the HIGH→LOW edge that shuts down the sampling transistor 18 and constitutes the sampling event for the incoming signal.

The operating principle of the loop network circuit 12 is based on inducing a transition 34 at the output node A4 (26) of the non-overlapping network 12, which transition 34 is not aligned with the complementary transition 36 at output node B4 (28) of network 12. This non-alignment is due to triggering the falling edge 34 of node A4 on the rising edge of transition 36 of node B4, thus forcing 3 gate delays (1 NAND+2 inverters) between the transition fronts, as further illustrated in the timing diagram 40 of FIG. 2. For sake of clarity, the NAND gate 44 of circuit 12 is shown where nodes are identified by "B" letters. Since the input 15 at node A1 of the NAND gate 42 of circuit 12 has already switched to the HIGH state synchronously with the node B1 falling edge, the state of NAND gate 44 is exclusively controlled by the output at node B4.

The rising edge of signal 33 at node B2 is instead synchronized to the falling edge of the input clock at node B1. In fact, since the self-consistency of the loop 12 forces the rising edge at node B2 to occur only when node A4 is HIGH, the input at node B1 is not "gated" by the NAND gate 44, which is transparent to it and acts as a simple inverter. On the other hand, the pull-down operation in the NAND gate 44 is only commanded by the other input, connected to node A4.

Figure 3:
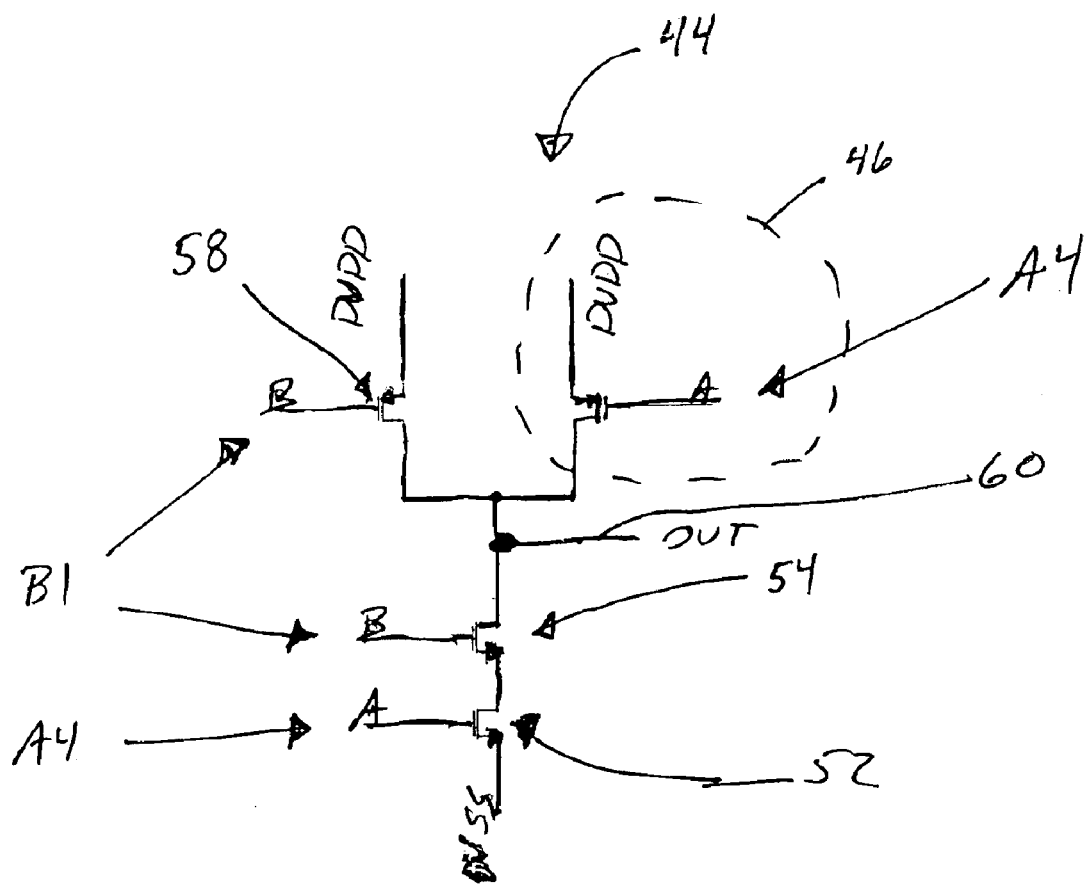
FIG. 3 depicts a conventional NAND gate used in the application of FIG. 1 using a well-known structure.

The standard, prior-art NAND gate 44 used for this application has the well-known structure as depicted in FIG. 3, and includes 2 large PMOSFET's including PMOSFET 46. This configuration ensures coverage of all the states and output transitions of the digital "truth table" of the NAND gate 44, in every possible combination/sequence of the two inputs.

Figure 2:
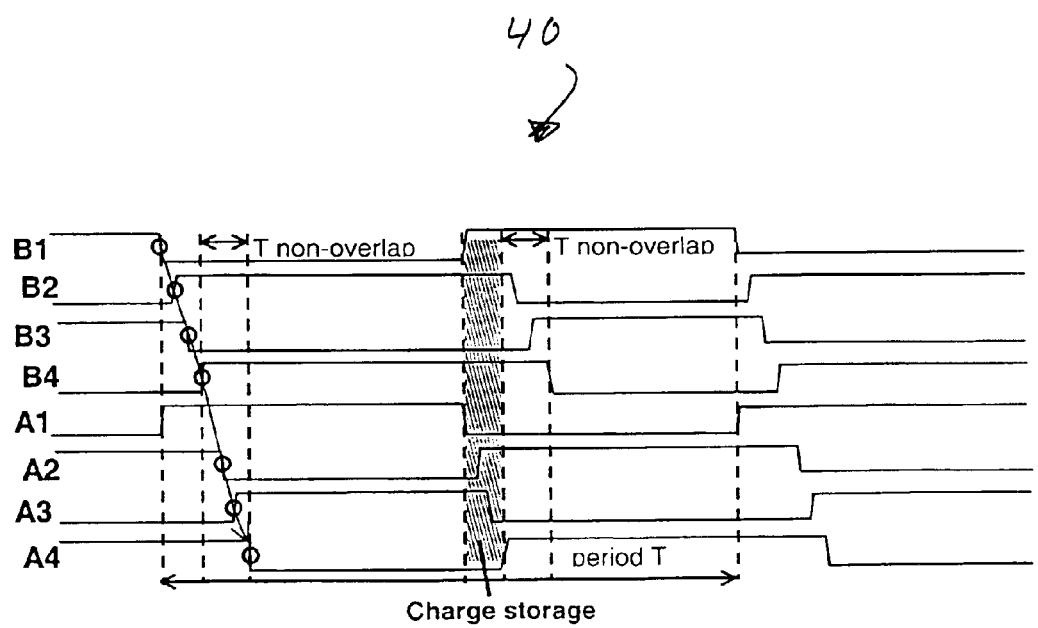
FIG. 2 is a timing diagram illustrating the principles of the circuit in FIG. 1 based on inducing a transition at the output node A4 and which is not aligned with the complementary transition at node B4, forcing 3 gate delays between them due to one NAND and two inverters gates.
Figure 4:
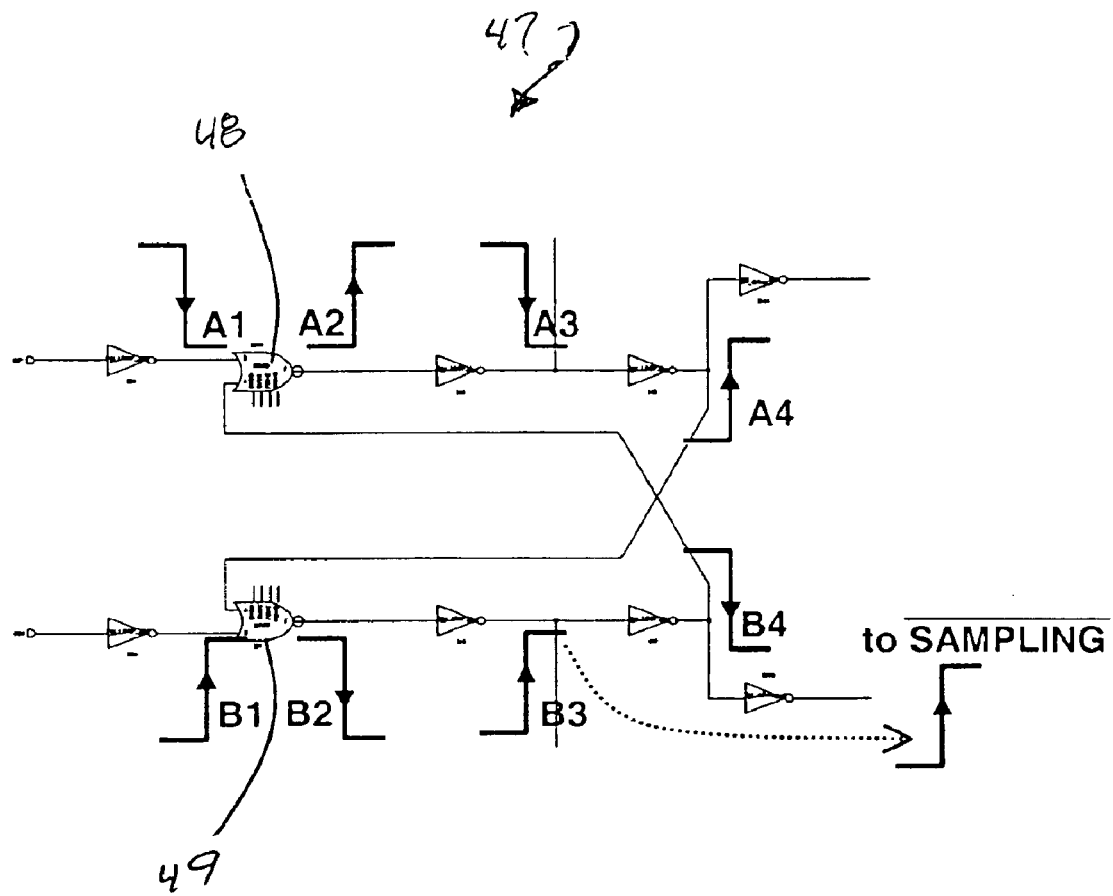
FIG. 4 illustrates an alternative implementation of the two-phase generation circuit depicted in FIG. 1 where the principle of duality is applied, to show how NOR gates, being dual of NAND gates, can benefit from this invention. In fact the pull-down edge of node B2 is solely controlled by the rising edge of the input at node B1.

A dual solution used for the generation of non-overlapped phase clock makes use of a NOR gate 48 (and 49) in place of the NAND gate 42 and 44, and is shown at 47 in FIG. 4. The whole timing diagram 40 in FIG. 2 is thus reversed: e.g., the NOR gate 49 pull-up front at node B2 is commanded by the output of the other side of the digital loop at node A4 of FIG. 4, while the pull-down edge at node B2 is solely controlled by the rising edge of the input at node B1. This configuration 47 can benefit as well from the present invention, through direct application of the principle of duality, as will now be discussed in considerable detail.

Figure 5:
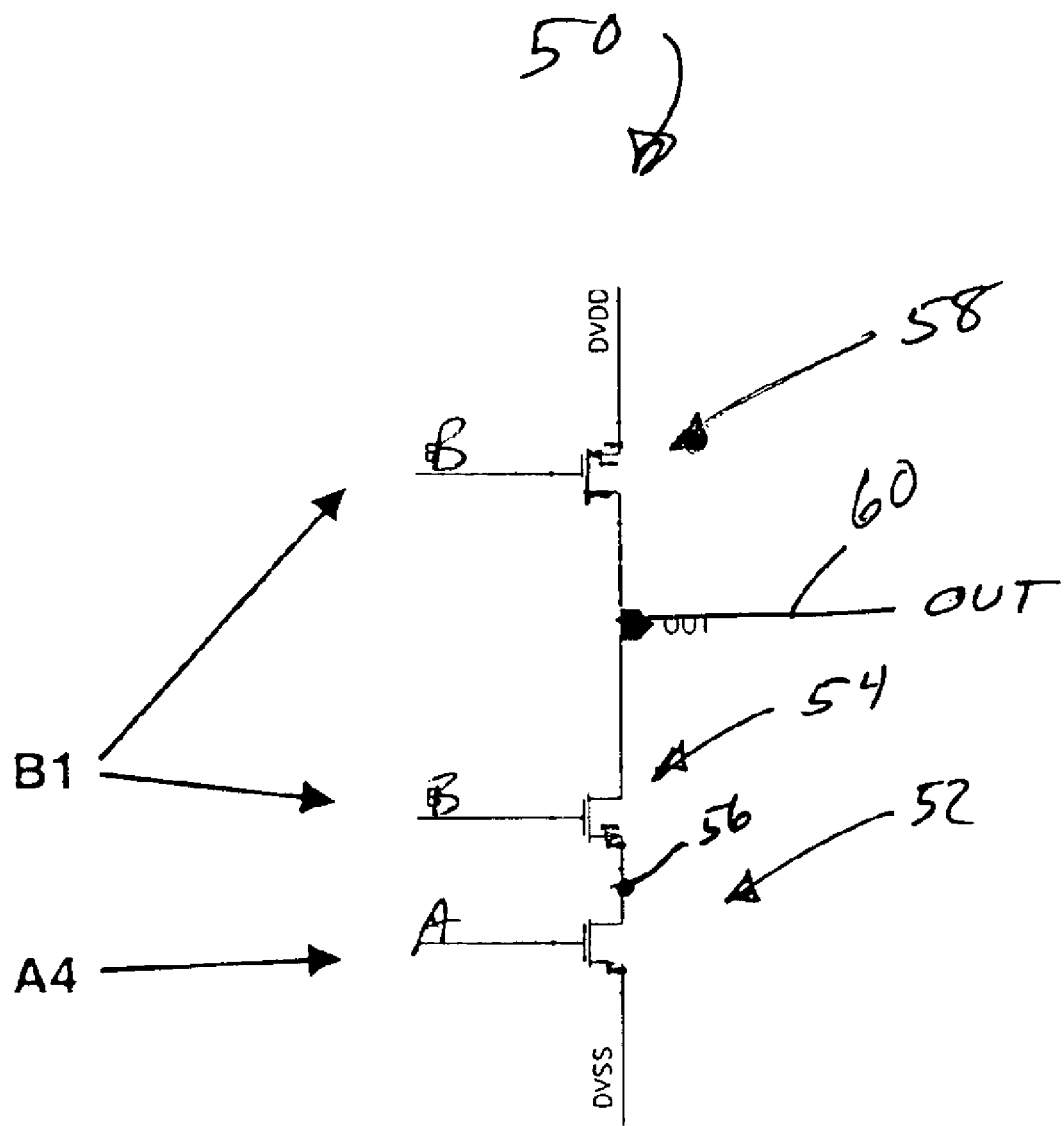
FIG. 5 is a NAND gate accordingly to the present invention which recognizes only one PMOSPET is needed to perform the output pull-up, and that A4 can drive the NMOSFET whose source is grounded, eliminating the body effect on the NAND device and making the pull-down transition the quickest possible.

A NAND gate of the present invention is shown in FIG. 5 at 50, which eliminates the one large PMOSFET 46 shown in FIG. 3. Since the pull-up operation of the B2 node is dictated by B1 only, keeping two PMOSFET devices in the NAND gate is redundant. In fact, the PMOSFET driven by A4 in FIG. 3 covers an input→output transition which is possible in principle, but that never happens in practice when the NAND is embedded in the classical two-phase clock loop of FIG. 1. The structure of the NAND gate can be simplified, becoming an inverter driven by B1, only, whose pull-down operation is conditioned to A4. Since node A4 features a rising edge when node B1 is in the HIGH state, the present invention advantageously recognizes node A4 can be connected to NMOSFET 52 whose source is grounded to DVSS, rather than to NMOSFET 54. The alternative connection (A4 driving NMOSFET 54) could perturb output 60 via feed through charge injection. Besides avoiding this perturbation, the proposed connection eliminates the body effect on the NAND 50, thus making the pull-down transition the quickest possible. Of course, the NMOSFET 54 controlled by node B1 is necessarily kept in this topology, since the input at node A4 is HIGH when the falling edge of the transition at node B1 occurs. Without the presence of the NMOSFET 54 controlled by node B1, a DVDD-DVSS short with considerable "crowbar" current would engender.

The simplified NAND gate 50 according to the present invention advantageously makes use of dynamic charge storage on the gates of the next inverter 17 and 19 (shown in FIG. 1) for a limited interval of time (when node A4 is LOW and node B1 is HIGH, i.e. immediately after the transition of the input clock and for a time span on the order of $T_{NON-OVERLAP}$) where in that condition the output of NAND 50 remains effectively insulated. The NAND gate 50 does not entail any major limitation on a lower clock frequency of operation, since the charge must be stored in the output node 60 for intervals of about 300–400 ps, and sometimes less, independent on the sampling rate. Clock rates as low as 300 kHz have been successfully tested with the new NAND gate 50 configuration of the present invention.

Figure 6:
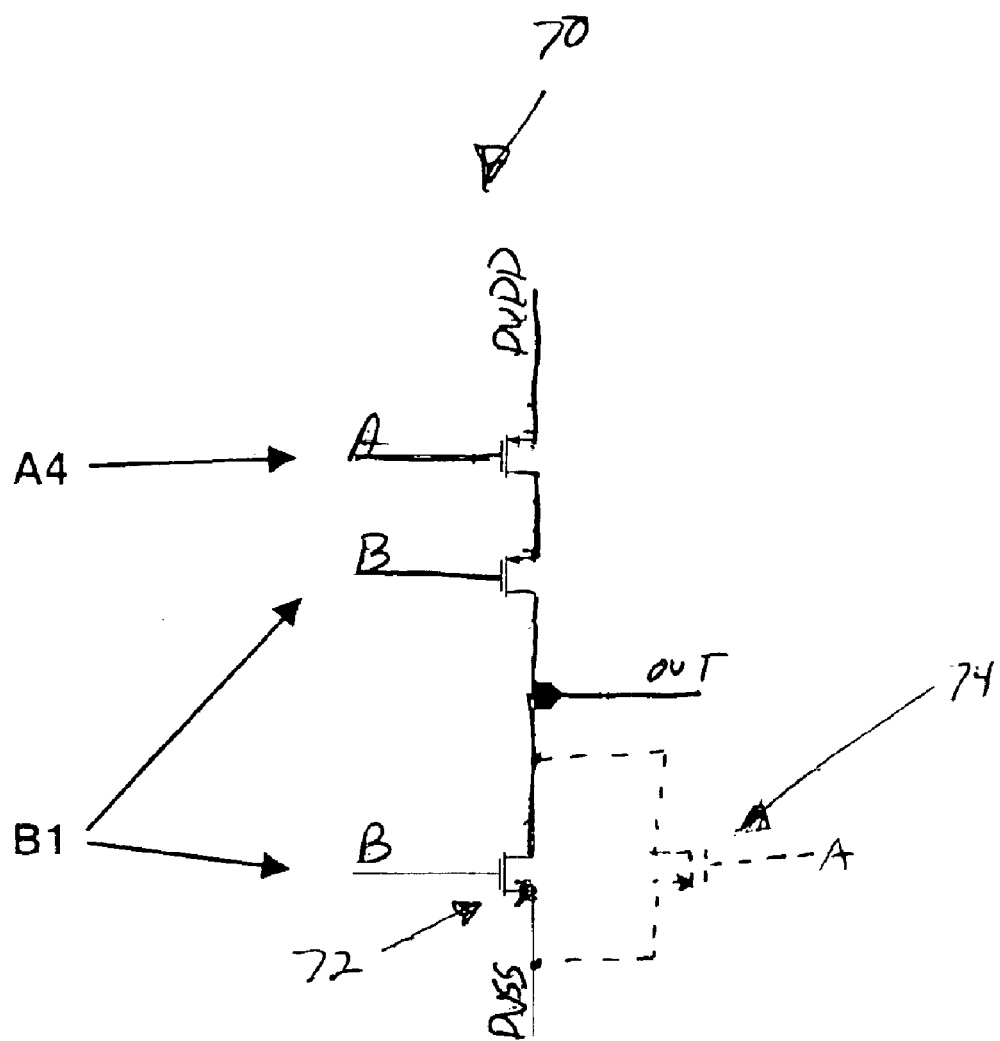
FIG. 6 depicts a NOR gate according to the principles of the present invention whereby the NMOSFET controlled by node A4 is eliminated.

The straightforward application of the duality principle to the present invention with regard to the NAND gate 50 also is applicable to a NOR gate 70 shown in FIG. 6. The device which can be eliminated from a prior art NOR gate is a NMOSFET (shown hyphenated at 74), in parallel to NMOSFET 72 and controlled by node A4. It is apparent how the need for two PMOSFETs in series actually remains, still forcing the designer to employ bulky devices with less efficient channel mobility, and increased size to counteract the cascade effect. Thus, NOR gate 70 provides less of an advantage than NAND gate 50 since the device which gets eliminated in NOR gate 70 is the more effective NMOSFET transistor 74 in parallel to NMOSFET 72 in prior art realization.

Figure 7:
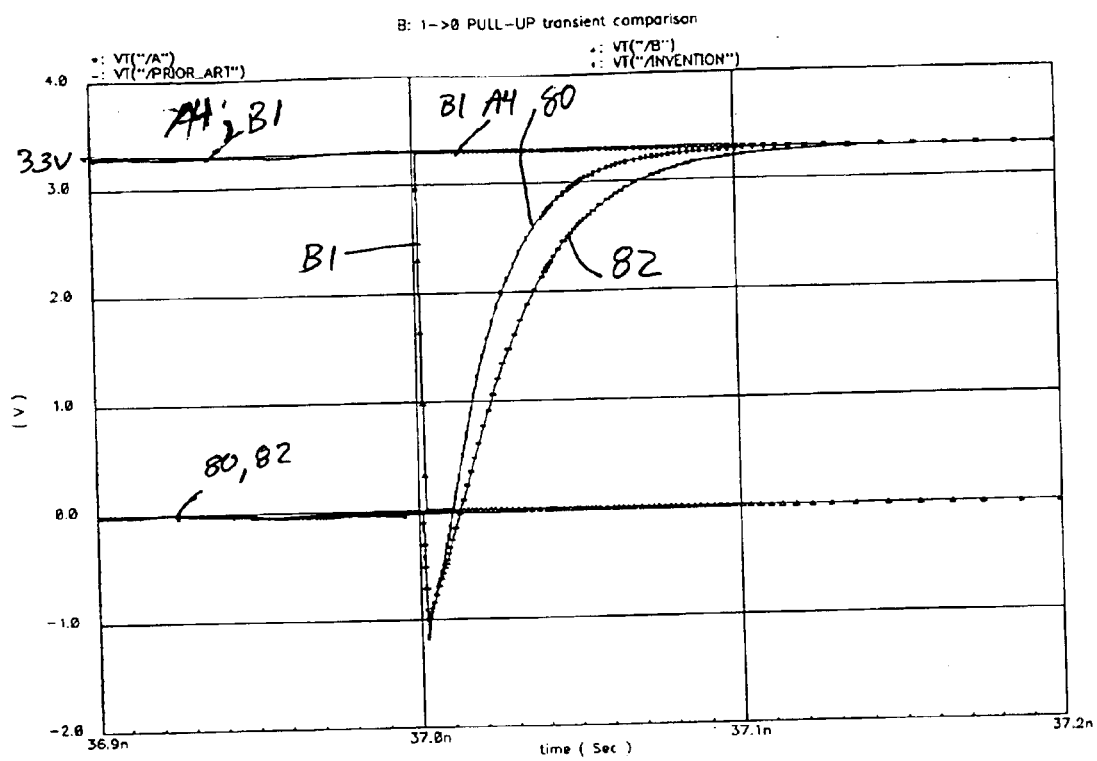
FIG. 7 depicts the increased pull-up edge slope using the NAND gate of the present invention.
Figure 8:
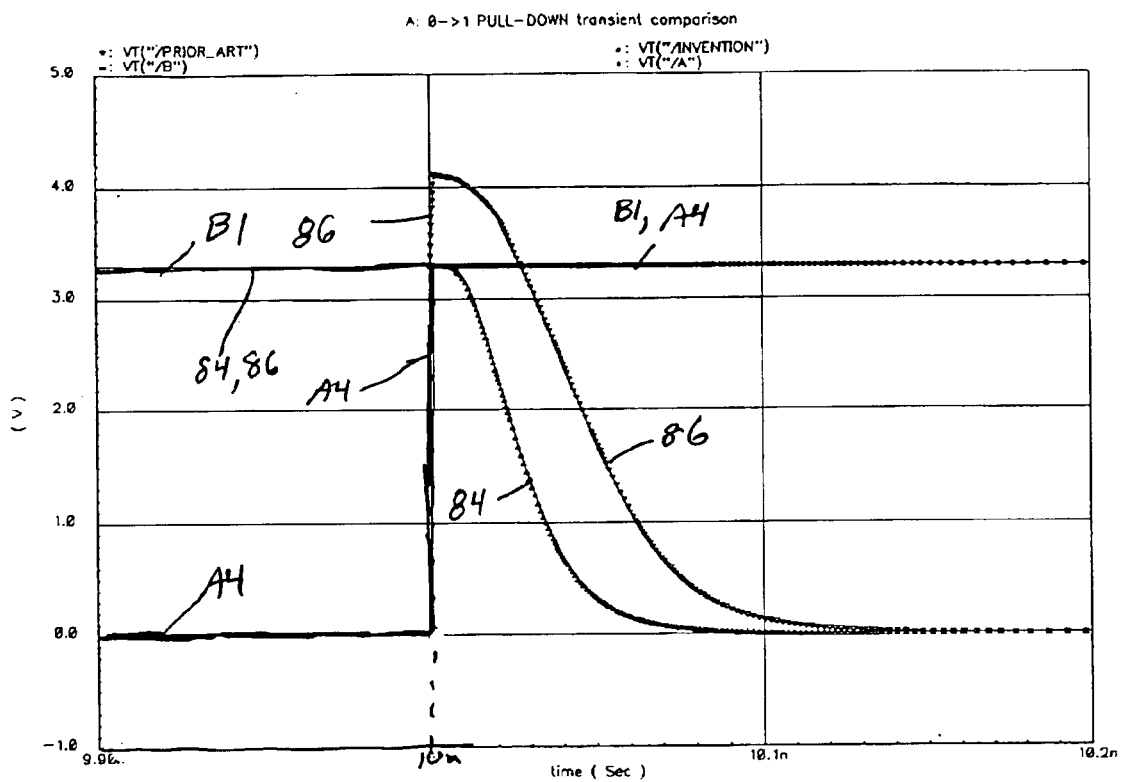
FIG. 8 depicts the pull-down transient driven by A4 being improved according to the present invention.
Figure 9:
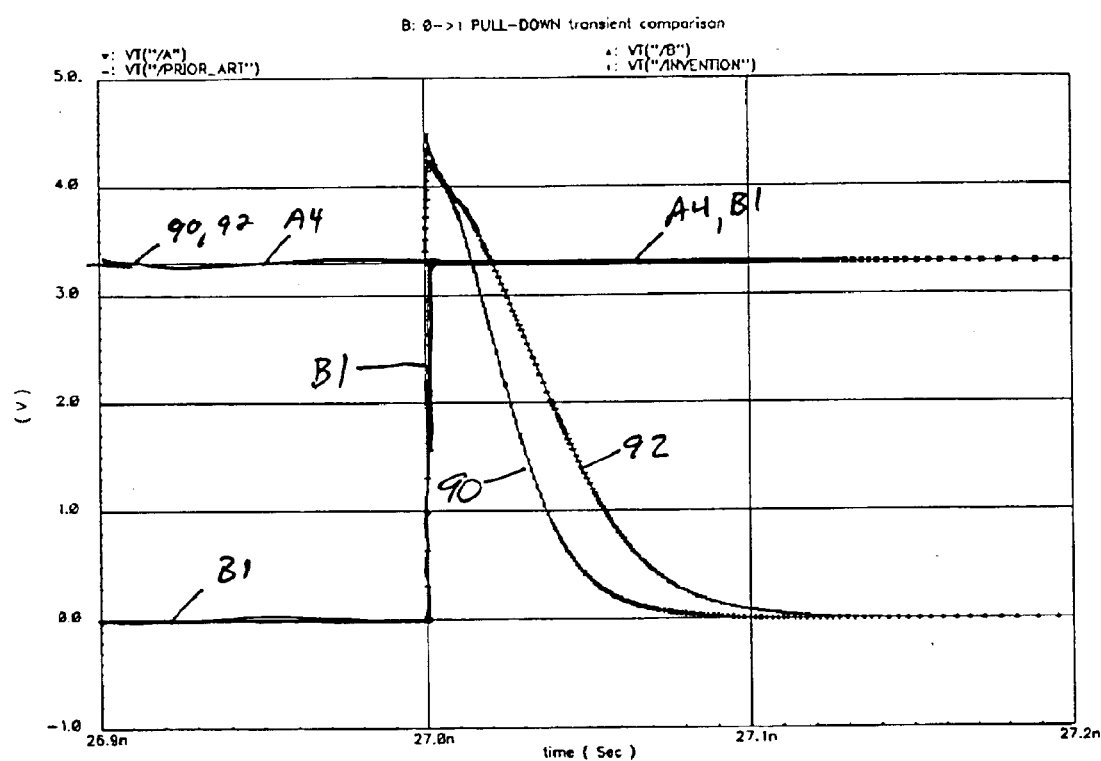
FIG. 9 depicts the increased speed of the circuit according to the present invention for the pull-down transient driven by B1 at the circuit's start-up, due to the reduced capacitive "ballasting" at the output.

The simulated evidence of the beneficial application of the invention to the clock generator circuit of FIG. 1 is shown in FIGS. 7 to 9 for the NAND gate 50. FIG. 7 depicts the faster transient behavior of the present invention at 80, as compared to a transient 82 using conventional NAND 44, simulated for the pull-up transition triggered by a falling edge of node B1 in FIG. 1. This is the most important transition occurring in the schematic 10 of FIG. 1, namely, the falling edge of the input at node B1 controls the operation of the sampling device 18, opening the NMOSFET. In order to drive the sampling device 18 with as clean a signal as possible, the best choice is to derive the sampling front from the input clock through as few gates as possible, from node B1 to node B3. The triggering event cannot come instead from the complementary branch, since it would have to travel through so many gates.

In the Spice simulation, the load of the NAND gate 50 is an inverter 19 whose total size equals the size of the NMOS-PMOS pair 52, 54 of the NAND 50, with a threshold centered to mid-rail. Even with the same loads, the absence of a bulky PMOSFET shown in the prior art NAND gate 44 (shown in FIG. 3) leads to a striking improvement in the steepness of the transition, as shown at 80. The slope of waveform 80 taken at the 1.65V threshold (3.3V supply) increases from 67.6V/μs to 96.9V/μs, thus improves 43%, as shown in FIG. 7. The advantageous enhancement can be fully capitalized into jitter reduction, provided all the other sources of instability (supply bounce, crosstalk, thermal noise of the other inverters/gates) have been properly minimized.

The other most important transition after the falling edge at node B1 is the pull-down transient, governed by node A4. Although the transient 84 of FIG. 8 could be theoretically used to drive a sampling event, it is not practical for very low jitter applications, such as a 14-bit ADC converter for wireless applications, for the reasons explained above. FIG. 8 shows the falling edge at the NAND 50 output 60 once the input source (node B1) has gone high, and node A4 features a rising edge mandated by the opposite branch of the circuit 12. The overshoot 86 from the input is much reduced due to the lack of feed through from the large PMOSFET 46 which was connected to node A4 in the prior art NAND 44 shown in FIG. 3, which remarkably affects, instead, such a solution. The effect is exacerbated by the extremely steep input edge (1 ps) adopted in simulation. The NAND gate 50 of present invention prevents a detrimental overshoot altogether, as shown, since the other transition (node B1 LOW→HIGH) happens when the sampling transistor 18 is fully conducting, hence cannot be perturbed by transients superimposed to the 3.3V level. The pull-down is completed by node A4 going HIGH, which only injects charge at node 56 between the two cascoded NMOSFETs 52 and 54 without affecting the output 60, as shown in FIG. 8 (see 84). Since node A4 is advantageously set to drive the FET transistor 52 with grounded source, no body effect hampers the transient 84.

The new NAND gate 50 still demonstrates a clear advantage over the prior art NAND 44. Since the NAND gate 50 has been designed to feature symmetrical in/out characteristic and pull up/down behavior, the pull-down slopes of NAND gate 50 and the prior art NAND gate 44 are almost identical to the ones previously detected during pull-up: 95.7V/μs against 66.6V/μs, or a 44% progress.

Finally, a transition never occurring during the normal operation of the circuit using NAND 50, but that may occur during the initial transient, is the output pull-down triggered by the input clock, or node B1 going HIGH. Although the overshoot caused by the feed-through from the input is present in this case, and is even slightly worse due to the reduced capacitive "ballasting" at the output 60, the speed of the NAND gate 50 still largely ameliorates the prior art: the slopes detected at 90 and 92 are respectively 98.8V/μs versus 66.7V/μs, or a 48% enhancement, as shown in FIG. 9.

Despite the NAND gate 50 lacks some of the otherwise allowed transitions on the truth table (i.e. node A4 cannot command a rising edge at the output) the NAND gate 50 does not cause any metastable states in the circuit 10 of FIG. 1. In fact, any "latched" voltage configuration is resolved at the next edge after half a period, hence, the network 12 comes out of metastability within 1 clock period—worst case.

The NAND gate 50 is superior to any passive-load gate in terms of pull-up capability and static power consumption (zeroed), in the same way as every CMOS implementation is superior to all NMOS schemes. The preservation of the active nature of the NAND logic gate 50, not resorting to passive elements but always having a transistor driving the output, constitutes another advantage.

The NAND gate 50 is superior to the classical CMOS implementation gate 44 in that it allows to reduce the self-loading at the gate output 60, saving dynamic power consumption and area in the gate itself and in all the previous inverters driving it, in a tapered "domino effect".

Plain CMOS solutions 44 have been compared ceteris paribus to the NAND gate 50 in simulation and show voltage transients prone to generating jitter in the clock circuit designed on chip, unlike NAND gate 50.

One main advantage of the present invention is the enhancement in the slope of the output transitions, both LOW→HIGH and HIGH→LOW, as demonstrated in FIGS. 7 and 8. The advantage comes from the NAND gate 50 having the same driving devices, but one less idle transistor 46 connected to the output 60. In the NAND gate 50, since the device eliminated is a PMOSFET 46, whose size exceeds the NMOS counterparts 52, 54 by a factor 2.5 to 3 to ensure symmetrical transfer function and optimize the noise margins, the gain in steepness is particularly dramatic. Since the RMS timing uncertainty of the clock period ($\sigma_T$) generated by the circuit 12 using NAND gate 50 is related to the RMS voltage noise at the output of each logic gate by dividing it by the slope of the waveform, such an advancement directly impacts the jitter performance of the clock. In a system like an ADC, or, more in general, for every application requiring a Sample/Hold stage, in turn this translates into the aperture uncertainty specification.

For example, in one conventional 14-bit 80 MSps ADC which adopts a prior art NAND gate 44 shown in FIG. 1, the utilization of the NAND gate 50 advantageously contributes to a jitter figure improvement from 530 fs down to 230 fs. With IF (Intermediate Frequencies) of the transceiver chains being pushed higher than 200 MHz, and resolutions of 12–14 bits, the jitter contribution becomes the dominant one, and such a reduction entails more than 6 dB of difference in SNR and possibly in SINAD, hence >1 bit in ENOB.

The final inverter driving node A4 now only sees the NMOSFET 52 of the NAND gate 50, and not PMOSFET 46, and can be sized smaller than when driving prior art NAND 44. In turn, given the customary adoption of an exponential tapering law for the inverters inside the loop 12 of circuit 10 of FIG. 1 and the ensuing buffer chain, a load reduction in the inverter driving node A4 reflects into a reduction in the inverter driving node A3, and in turn allows for a smaller NAND sizing to begin with. Besides optimizing jitter, the present invention thus enables a lower power consumption for the clock circuit 10 as a whole.

A straightforward advantage coming from the reduction in the transistor count is the decrease in area and wiring layout complexity.

As shown in FIGS. 7–9, the charge injection of NAND gate 50 into the output 60 is either the same as in prior art (pull-up transition), or, completely canceled out (pull-down). In fact, either the PMOS device governed by node B1 executes the pull-up, and the transistor configuration is same as the standard gate, or, the NMOS governed by node A4 executes the pull-down, which is not directly tied to the output 60 and allows for a transient without feed through. Furthermore, to start from the rail voltage, and not above it, results eventually in a faster transition.

As a corollary, the lack of signal feed-through taking the output voltages beyond the rails during certain transitions implies less stressing of the driven inverter gates, or, better compliance with reliability guidelines.

It has been mentioned that the new gates dynamically store charge. As opposite to the host of dynamic logics that are based onto this principle (NORA, Domino logics), the present invention a) does not employ any form of clocked precharge; and b) does not require the charge to be held for half a cycle (as shown for prior art NAND 44 in FIG. 2): $T_{nonoverlap} \ll T_{cycle}/2$ is the required storage time.

The present invention finds particular advantages in clock circuits of Analog-to-Digital data converters as well as any circuit having a two-phase non-overlapped clock generator.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. A circuit, comprising;
a two-phase non-overlapping signal generator responsive to an external clock and generating a first phase and a second phase, the generator outputting a sampling signal at a sampling rate adapted to control a sampling device, the generator comprising a first NAND gate comprised of two NMOSFETs and only one PMOSFET.

2. The circuit as specified in claim 1 wherein the first NAND gate is responsive to the external clock and the first phase.

3. The circuit as specified in claim 1 wherein the generator comprises a first circuit portion generating the first phase and an identical second circuit portion generating the second phase, wherein the first NAND gate forms a portion of the second circuit portion.

4. The circuit as specified in claim 1 wherein the generator comprises a first circuit portion including the first NAND gate and circuit portion further comprises at least two inverter gates, and a second circuit portion comprises a second NAND gate and at least two inverter gates. including an inverter gate responsively coupled to the first NAND gate.

5. The circuit as specified in claim 1 wherein the generator further comprises an inverter gate, wherein the first NAND gate utilizes dynamic charge storage of the inverter gate for a limited interval of time.

6. The circuit as specified in claim 5 wherein the first NAND gate has an output effectively insulated when utilizing the inverter gate dynamic charge.

7. The circuit as specified in claim 5 wherein the inverter gate has a charge storage interval which is independent of the sampling rate.

8. The circuit as specified in claim 6 wherein the charge storage interval is less than 300 ps.

9. The circuit as specified in claim 6 wherein the charge storage interval is about 300–400 ps.

10. The circuit as specified in claim 5 wherein the first NAND gate has approximately the same capacitive load as the inverter gate.

11. The circuit as specified in claim 3 wherein one said NMOSFET has its source grounded and is driven by the first phase.

12. A two-phase non-overlapping clock generator generating a sampling signal, comprising:
a first NAND gate receiving an external clock and serially coupled to at least a first inverter gate; and
a second NAND gate receiving the external clock and serially coupled to at least a second inverter gate, the first inverter gate being coupled to an input of the second NAND gate, wherein the second NAND gate is comprised of two NMOSFETS and only one PMOSFET.

13. The circuit as specified in claim 12 wherein the second NAND gate reduces the loading effect on the first inverter gate as compared to a standard NAND gate having two PMOSFETS.

14. The circuit as specified in claim 12 wherein the second NAND gate utilizes a dynamic charge storage of the second inverter gate for a limited interval of time.

15. The circuit as specified in claim 14 wherein the second NAND gate has an output effectively insulated when utilizing the second inverter gate dynamic charge.

16. The circuit as specified in claim 14 wherein the second inverter has a charge storage interval which is independent of the sampling rate.

17. The circuit as specified in claim 16 wherein the charge storage interval is less than 300 ps.

18. The circuit as specified in claim 16 wherein the charge storage interval is about 300–400 ps.

19. The circuit as specified in claim 12 wherein the second NAND gate has approximately the same capacitive load as the second gate.

20. The circuit as specified in claim 12 wherein the second NAND gate comprises two NMOSFETs and only one PMOSFET, wherein one of the NMOSFETs has its source grounded.

21. The circuit as specified in claim 12 wherein said first NAND gate is serially coupled to a plurality of inverter gates.

22. The circuit as specified in claim 21 wherein said second NAND gate is serially coupled to a plurality of inverter gates.

23. The circuit as specified in claim 20 wherein the first inverter is coupled to the NMOSFET having its source grounded.

24. A two-phase non-overlapped clock generator generating a sample signal, comprising:
a first NOR gate receiving the external clock and serially coupled to at least a first inverter gate;
a second NOR gate serially coupled to at least a second inverter gate, said first inverter gate being coupled to an input of the second NOR gate, wherein the second NOR gate is comprised of two PMOSFETS and only one NMOSFET.

25. The circuit as specified in claim 24 wherein the first NOR gate is responsive to the external clock and the first phase.

26. The circuit as specified in claim 24 wherein the generator comprises a first circuit portion generating the first phase and an identical second circuit portion generating the second phase, wherein the first NOR gate forms a portion of the second circuit portion.

27. The circuit as specified in claim 24 wherein the generator comprises a first circuit portion including the first NOR gate and circuit portion further comprises at least two inverter gates, and a second circuit portion comprises a second NOR gate and at least two inverter gates.

28. The circuit as specified in claim 24 further including an inverter gate responsively coupled to the first NOR gate.

29. The circuit as specified in claim 28 wherein the generator further comprises an inverter gate, wherein the first NOR gate utilizes dynamic charge storage of the inverter gate for a limited interval of time.

30. The circuit as specified in claim 28 wherein the first NOR gate has an output effectively insulated when utilizing the inverter gate dynamic charge.

31. The circuit as specified in claim 28 wherein the inverter gate has a charge storage interval which is independent of the sampling rate.

32. The circuit as specified in claim 30 wherein the charge storage interval is less than 300 ps.

33. The circuit as specified in claim 30 wherein the charge storage interval is about 300–400 ps.

34. The circuit as specified in claim 28 wherein the first NOR gate has approximately the same capacitive load as the inverter gate.

35. The circuit as specified in claim 26 wherein one said PMOSPET has its source grounded and is driven by the first phase.

36. A two-phase non-overlapping clock generator generating a sampling signal comprising:
   a first NOR gate receiving an external clock and serially coupled to at least a first inverter gate; and
   a second NOR gate receiving the external clock and serially coupled to at least a second inverter gate, the first inverter gate being coupled to an input of the second NOR gate, wherein the second NOR gate is comprised of two PMOSFETS and only one NMOSFET.

37. The circuit as specified in claim 36 wherein the second NOR gate reduces the loading effect on the first inverter gate as compared to a standard NOR gate having two NMOSFETS.

38. The circuit as specified in claim 36 wherein the second NOR gate utilizes a dynamic charge storage of the second inverter gate for a limited interval of time.

39. The circuit as specified in claim 38 wherein the second NOR gate has an output effectively insulated when utilizing the second inverter gate dynamic charge.

40. The circuit as specified in claim 38 wherein the second inverter has a charge storage interval which is independent of the sampling rate.

41. The circuit as specified in claim 40 wherein the charge storage interval is less than 300 ps.

42. The circuit as specified in claim 40 wherein the charge storage interval is about 300–400 ps.

43. The circuit as specified in claim 36 wherein the second NOR gate has approximately the same capacitive load as the second gate.

44. The circuit as specified in claim 36 wherein the second NOR gate comprises two PMOSFETs and only one NMOSFET, wherein one of the PMOSFETs has its source grounded.

45. The circuit as specified in claim 36 wherein said first NOR gate is serially coupled to a plurality of inverter gates.

46. The circuit as specified in claim 36 wherein said second NOR gate is serially coupled to a plurality of inverter gates.

47. The circuit as specified in claim 44 wherein the first inverter is coupled to the PMOSFET having its source grounded.

* * * * *